(12) United States Patent
Lee et al.

(10) Patent No.: US 8,097,881 B2
(45) Date of Patent: Jan. 17, 2012

(54) THIN FILM TRANSISTOR SUBSTRATE AND A FABRICATING METHOD THEREOF

(75) Inventors: Young-Wook Lee, Suwon-si (KR);
 Hong-Suk Yoo, Anyang-si (KR);
 Jean-Ho Song, Seoul (KR);
 Jae-Hyoung Youn, Seoul (KR); Jong-In Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 134 days.

(21) Appl. No.: 12/502,653

(22) Filed: Jul. 14, 2009

(65) Prior Publication Data
US 2010/0032664 A1 Feb. 11, 2010

(30) Foreign Application Priority Data
Aug. 6, 2008 (KR) .......................... 10-2008-0076813

(51) Int. Cl.
 *H01L 29/76* (2006.01)
 *H01L 29/04* (2006.01)
 *H01L 31/036* (2006.01)
 *H01L 27/01* (2006.01)
 *H01L 27/12* (2006.01)

(52) U.S. Cl. ............... 257/66; 257/72; 257/347; 257/59
(58) Field of Classification Search ................... 257/66, 257/223, 227, 291, 292, 439, 443, 655, 43, 257/72, 59, 40, 347, 350, 351
See application file for complete search history.

(56) References Cited

U.S. PATENT DOCUMENTS

| 6,867,108 | B2 * | 3/2005 | Jeong et al. | 438/384 |
| 2007/0161160 | A1 * | 7/2007 | Chen | 438/149 |

* cited by examiner

*Primary Examiner* — Chuong A. Luu
(74) *Attorney, Agent, or Firm* — Cantor Colburn LLP

(57) ABSTRACT

An oxide semiconductor thin film transistor substrate includes a gate line and a gate electrode disposed on an insulating substrate, an oxide semiconductor pattern disposed adjacent to the gate electrode, a data line electrically insulated from the gate line, the data line and the gate line defining a display region, a first opening exposing a surface of the data line, a second opening exposing a surface of the oxide semiconductor pattern, and a drain electrode disposed on the first opening and a drain electrode pad, the drain electrode extending from the first opening to the second opening and electrically connecting the drain electrode pad and the oxide semiconductor pattern.

19 Claims, 11 Drawing Sheets

THIN FILM TRANSISTOR SUBSTRATE AND A FABRICATING METHOD THEREOF

This application claims priority to Korean Patent Application No. 10-2008-0076813, filed on Aug. 6, 2008, and all the benefits accruing threrefrom under 35 U.S.C. §119, the contents of which in its entirety are herein incorporated by reference.

BACKGROUND OF THE INVENTION (1) Field of the Invention

This disclosure relates to a thin film transistor substrate and a fabricating method thereof.

(2) Description of the Related Art

Liquid crystal display ("LCD") devices include a first substrate, which includes a thin film transistor ("TFT"), a second substrate disposed opposite the first substrate, and a liquid crystal layer interposed between the first and the second substrates. The liquid crystal layer may have anisotropic dielectric properties. LCDs can display images by adjusting the amount of light transmitted through the liquid crystal layer. The behavior of a liquid crystal layer can be controlled by a voltage difference applied to a common electrode and a pixel electrode. TFTs are widely used as a switching device in an LCD.

TFTs are switching devices, which include a gate electrode, a drain electrode, a source-pixel electrode, and an active layer. When a voltage higher than a threshold voltage is applied to the gate electrode, current can flow between the drain electrode and the source-pixel electrode. The active layer of a TFT can include amorphous silicon ("a-Si"), or polycrystalline silicon ("poly-Si").

In order to produce a larger and higher resolution display, a thin film transistor substrate with a high field effect mobility would be desirable. Additionally, in order to fabricate a larger display with an integrated driving circuit in the panel, it would be desirable to decrease a line resistance and a parasitic capacitance. It would also be desirable to increase the field effect mobility of a thin film transistor, which can be used as a switching device or a driving device. Recently, a microcrystalline silicon layer, which can be disposed by a deposition method, and a polycrystalline silicon layer, which can be disposed by crystallization of an a-Si layer, have been investigated for fabrication of a thin film transistor with a high field effect mobility. However, current microcrystalline thin film transistors show low field effect mobility, and an improved deposition apparatus would be desirable in order to improve the electrical properties of current microcrystalline thin film transistors. A polycrystalline silicon thin film transistor can have acceptable field effect mobility, but a commercially available apparatus for the crystallization process is costly, and a uniformity of the field effect mobility of a commercially available polycrystalline silicon thin film transistor is poor due to the crystallization mechanism.

To resolve these and other problems, application of an oxide semiconductor as an active layer in a thin film transistor has been considered. Because the field effect mobility of an oxide semiconductor thin film transistor can be greater than ten times higher than that of an a-Si TFT, a pixel chargeability can be increased and integration of a driving circuit, including the oxide semiconductor thin film transistor substrate, would be desirable. Moreover, a fabrication process of an oxide semiconductor TFT may be similar to that of an a-Si TFT. However, current processes, which are performed after disposing an oxide semiconductor, such as a plasma process or a wet process, or electrical stress, can degrade one or more electrical properties of the oxide semiconductor thin film transistor.

BRIEF SUMMARY OF THE INVENTION

Exemplary embodiments include an oxide semiconductor thin film transistor of high productivity and reliability, and a method of forming the same.

Thus the above described and other drawbacks are alleviated by a thin film transistor substrate including a gate line and a gate electrode disposed on an insulating substrate; an oxide semiconductor pattern disposed adjacent to the gate electrode; a data line electrically insulated from the gate line, the data line and the gate line defining a display region; a first opening exposing a surface of the data line; a second opening exposing a surface of the oxide semiconductor pattern; and a drain electrode disposed on the first opening and a drain electrode pad, the drain electrode extending from the first opening to the second opening and electrically connecting the drain electrode pad and the oxide semiconductor pattern.

Also disclosed is a thin film transistor wherein a second insulating layer and a third insulating layer are disposed on the oxide semiconductor pattern.

Also disclosed is a thin film transistor wherein a third opening exposes a surface of the oxide semiconductor pattern.

Also disclosed is a thin film transistor wherein the second opening and the third opening expose a surface of the oxide semiconductor pattern through the second insulating layer and the third insulating layer.

Also disclosed is a thin film transistor wherein the first opening exposes a surface of the oxide semiconductor pattern through the third insulating layer.

Also disclosed is a thin film transistor wherein a source-pixel electrode is electrically connected to the oxide semiconductor pattern through the third opening.

Also disclosed is a thin film transistor wherein the source-pixel electrode is in direct contact with the oxide semiconductor pattern.

Also disclosed is a thin film transistor wherein the oxide semiconductor pattern includes at least one of Ga, In, Zn, Sn, Ta, Ti, Cr, Hf, Y, Fe, Ru, Cd, Li Be, Na, Mg, V, Zr, Nb, Sc, W, Mn, Fe, Ni, Pd, Cu, B, Al, Ge, Si, C, N, P, F and O, and a combination including at least one of the foregoing elements.

Also disclosed is a thin film transistor wherein the drain electrode includes at least one of Ga, In, Zn, Sn, Ta, Ti, Cr, Hf, Y, Fe, Ru, Cd, Li Be, Na, Mg, V, Zr, Nb, Sc, W, Mn, Fe, Ni, Pd, Cu, B, Al, Ge, Si, C, N, P, F and O, and a combination including at least one of the foregoing elements.

Also disclosed is a thin film transistor wherein the data line is disposed apart from the oxide semiconductor pattern.

Also disclosed is a thin film transistor wherein the source-pixel electrode includes a first material, the drain electrode includes a second material, and the first material is the same as the second material.

Also disclosed is a thin film transistor wherein the source-pixel electrode defines the pixel area.

Also disclosed is a thin film transistor wherein an edge of the second insulating layer includes a shape, which corresponds to a shape of an edge of the oxide semiconductor pattern.

Also disclosed is a thin film transistor wherein the drain electrode pad includes a third material, the data line includes a fourth material, and the third material is the same as the fourth material.

Also disclosed is a thin film transistor wherein, the drain electrode is in direct contact with the drain electrode pad.

Also disclosed is a thin film transistor wherein the third opening exposes a surface of the oxide semiconductor pattern.

Also disclosed is a thin film transistor wherein a source-pixel electrode contacts the oxide semiconductor pattern through the third opening.

Also disclosed is a thin film transistor wherein the drain electrode pad includes a third material, the source-pixel electrode includes a first material, and the third material is the same as the first material.

In another exemplary embodiment, a method of manufacturing a thin film transistor includes disposing a gate line and a gate electrode on an insulating substrate, the gate electrode protruding from the gate line; disposing a first insulating layer on the gate line; disposing an oxide semiconductor pattern and a second insulating layer adjacent to the gate electrode; disposing a data line, which is insulated from the gate line; disposing a third insulating layer on the gate line, the data line and a drain electrode pad; disposing a first opening on the drain electrode pad through the third insulating layer; disposing a second opening on the oxide semiconductor pattern through the second insulating layer and the third insulating layer; and disposing a drain electrode on the first opening, the drain electrode pad, and the second opening, wherein the drain electrode extends from the first opening to the second opening, and the drain electrode electrically connects the drain electrode pad and the oxide semiconductor pattern through the first opening and the second opening.

In another exemplary embodiment, the method further includes disposing a third opening, which exposes a surface of the oxide semiconductor pattern through the second insulating layer and the third insulating layer.

In another exemplary embodiment, disclosed is a method wherein the drain electrode and the source-pixel electrode are disposed using the same photo mask.

In another exemplary embodiment, the second insulating layer and the oxide semiconductor pattern are disposed using the same photo mask.

In another exemplary embodiment, the drain electrode and the source-pixel electrode may be disposed using the same photo mask.

Also disclosed is a thin film transistor substrate including a gate line and a gate electrode disposed on an insulating substrate; an oxide semiconductor pattern disposed adjacent to the gate electrode; a data line, which is insulated from the gate line, disposed on the insulating substrate; a first opening exposing a surface of the data line; an etch stopper layer, which has a shape which is substantially similar to a shape of the oxide semiconductor pattern; a second opening exposing the oxide semiconductor pattern; and a drain electrode disposed on the first opening and the second opening, wherein the drain electrode electrically connects the data line and the oxide semiconductor pattern through the first opening and the second opening.

BRIEF DESCRIPTION OF THE DRAWINGS

The above and other aspects, advantages, and features of the invention will become more apparent and more readily appreciated from the following further description of the exemplary embodiments, taken in conjunction with the accompanying drawings in which.

DETAILED DESCRIPTION OF THE INVENTION

Figure 1A:
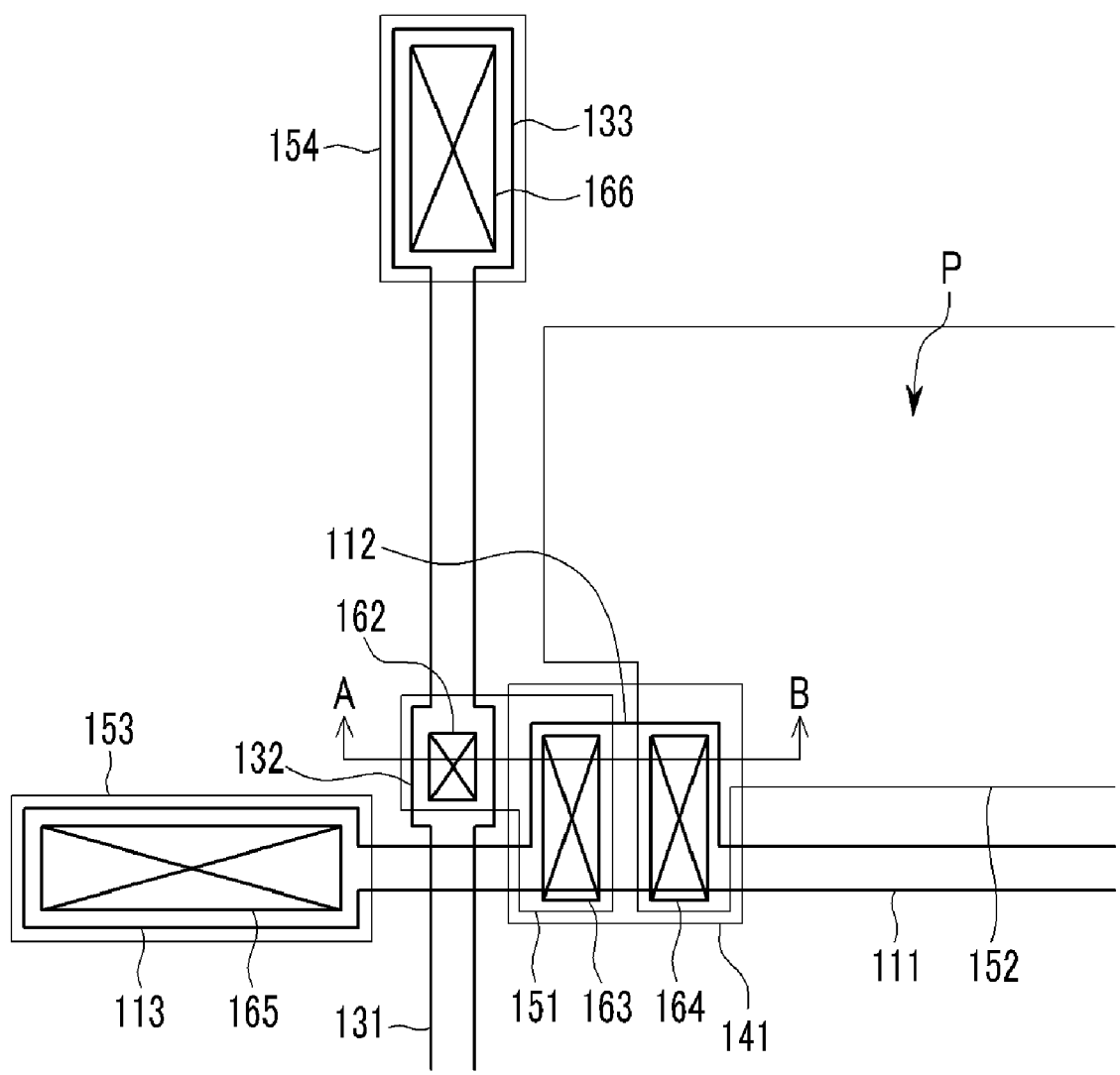
FIG. 1a and FIG. 1b are respectively a plan view and a cross-sectional view showing an exemplary embodiment of a thin film transistor.

The invention is described more fully hereinafter with reference to the accompanying drawings, in which exemplary embodiments are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or element, it can be directly on the other layer or element, or intervening layers may also be present. Further, it will be understood that when a layer is referred to as being "under" another layer or element, it can be directly under, and one or more intervening layers or elements may also be present. In addition, it will also be understood that when a layer or an element is referred to as being "between" two layers or elements, it can be the only layer between the two layers or elements, or one or more intervening layers or elements may also be present. Like reference numerals refer to like elements throughout.

It will be understood that the order in which operating steps of each fabrication method disclosed in this disclosure are performed is not restricted to those set forth herein, unless specifically mentioned otherwise. Accordingly, the order in which operating steps of each fabrication method disclosed in this disclosure are performed can be varied within the scope of the invention, and the resulting consequences that would be understood by one of ordinary skill in the art to which the invention pertains are regarded as being within the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1B:
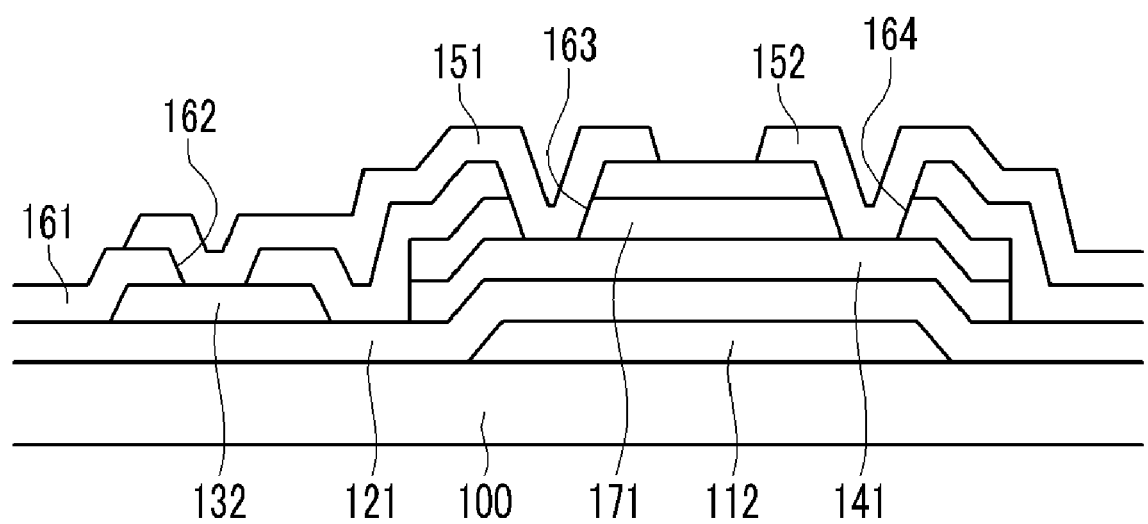

FIG. 1a is a plan view showing an exemplary embodiment of a thin film transistor ("TFT") disposed by an exemplary embodiment of a method of fabricating the TFT, and FIG. 1b is a cross-sectional view showing an exemplary embodiment of the TFT along line A-B of FIG. 1a.

Referring to FIG. 1a and FIG. 1b, a gate line 111, a gate electrode 112, and a gate pad 113, which extend from the gate line 111, are disposed on an insulating substrate 100. The gate pad 113 may be connected to a driving circuit (not shown), which supplies a driving signal to the TFT. The insulating substrate 100 may comprise a transparent glass, a transparent plastic substrate, a metal substrate with an insulating buffer layer thereon, or the like, or a combination comprising at least one of the foregoing materials. The gate electrode 112, the gate line 111, and the gate pad 113, may be disposed at the same time, and may be a single layer or comprise multiple layers, and can comprise at least one of Al, Cu, Mo, Nd, Ti, Pt, Ag, Nb, Cr, W, Ta, and the like, and a combination comprising at least one of the foregoing elements. A gate insulating layer may be disposed on or under the gate electrode 112, the gate line 111, and the gate pad 113. The gate insulating layer 121 may comprise at least one of $SiO_x$, $SiN_x$ and $SiON_x$, and the like, and a combination comprising at least one of the foregoing materials. In addition, the gate insulating layer may further comprise carbon (C), and the carbon, if present, may be included in the $SiO_x$, $SiN_x$, $SiON_x$, or combination thereof.

An oxide semiconductor pattern 141 may be disposed on the gate insulating layer 121. The oxide semiconductor pattern 141 may comprise at least one of Ga, In, Zn, Sn, Ta, Ti, Cr, Hf, Y, Fe, Ru, Cd, Li Be, Na, Mg, V, Zr, Nb, Sc, W, Mn, Fe, Ni, Pd, Cu, B, Al, Ge, Si, C, N, P, F, O, and the like, and a combination comprising at least one of the foregoing elements. An exemplary oxide semiconductor pattern may comprise Zn—O, In—Ga—Zn—O, Zn—In—O, Zn—Sn—O, In—Zn—Hf—O, Sn—In—O, Sn—O, or the like, or a combination comprising at least one of the foregoing oxides, and the oxide semiconductor pattern may comprise a multi-layered structure. The oxide semiconductor pattern 141 may be polycrystalline, or the oxide semiconductor pattern 141 may be a single crystal. In an embodiment, the oxide semiconductor pattern 141 may comprise a composite structure comprising amorphous and crystalline materials. The field effect mobility of a TFT comprising the oxide semiconductor pattern as an active layer is higher than that of a TFT comprising a hydrogenated amorphous silicon ("a-Si:H") material as an active layer. When the oxide semiconductor pattern comprises $In_2O_3$, $Ga_2O_3$, and ZnO, the oxide semiconductor pattern can comprise a Ga—In—Zn—O oxide semiconductor. A field effect mobility of a TFT comprising an oxide semiconductor pattern which comprises a Ga—In—Zn—O oxide semiconductor is about 20 times higher than a field effect mobility of an a-Si:H TFT.

An etch stopper layer 171 may be disposed on the oxide semiconductor pattern 141. The thickness of the etch stopper layer may be between about 100 angstroms("Å") to about 10000 Å, specifically between about 500 Å to about 5000 Å, more specifically between about 1000 Å to about 4000 Å, and the etch stopper layer may comprise an inorganic insulator comprising at least one of $SiO_x$, $SiN_x$, $SiOC_x$, $SiON_x$, and the like, and a combination comprising at least one of the foregoing materials, or the etch stopper layer may comprise an organic insulator comprising a resin, a polymeric organic material, or the like, or a combination comprising at least one of the foregoing materials. A portion of the oxide semiconductor pattern 141 and the etch stopper layer 171 may comprise a substantially identical planar pattern shape. A data line 131, data pad 133, and drain electrode pad 132, are disposed on the gate insulating layer 121 apart from the oxide semiconductor pattern 141. The data pad 133 may transmit a data driving signal, which can be applied from an external data driving circuit (not shown) to the data line 131. The drain electrode pad 132 may transmit the data driving signal from the data line 131 to the TFT. The data line 131, the data pad 133, and the drain electrode pad 132, may comprise the same material, and may comprise a single layer or a multiple layer structure comprising at least one of Al, Cu, Mo, Nd, Ti, Pt, Ag, Nb, Cr, W, Ta, and the like, and a combination comprising at least one of the foregoing. The passivation layer 161 may be disposed on the data line 131, the data pad 133, and the drain electrode pad 132. The thickness of the passivation layer 161 may be between about 100 Å to about 10000 Å, specifically between about 500 Å to about 5000 Å, more specifically between about 1000 Å to about 4000 Å, and the passivation layer may comprise an inorganic insulator comprising at least one of $SiO_x$, $SiN_x$, $SiOC_x$, and $SiON_x$, and the like, and a combination comprising at least one of the foregoing materials, or the passivation layer may comprise an organic insulator comprising a resin, a polymeric organic material, or the like, or a combination comprising at least one of the foregoing materials.

A drain electrode 151 and a source-pixel electrode 152 may be disposed on the passivation layer 161. A pixel area P may be defined by the shape of the source-pixel electrode. Thus, the source-pixel electrode 152 may function as a pixel electrode having a pixel area P. The drain electrode 151, and the source-pixel electrode 152, may comprise a transparent conducting electrode comprising at least one of amorphous silicon, polycrystalline silicon, or single crystal silicon, and the like, and a combination comprising at least one of the foregoing materials. The drain electrode 151, and the source-pixel electrode, may comprise at least one of Ga, In, Zn, Sn, Ta, Ti, Cr, Hf, Y, Fe, Ru, Cd, Li Be, Na, Mg, V, Zr, Nb, Sc, W, Mn, Fe, Ni, Pd, Cu, B, Al, Ge, Si, C, N, P, F, O, and the like, and a combination comprising at least one of the foregoing elements. In an exemplary embodiment, the drain electrode 151 and the source-pixel electrode 152 may comprise an amorphous-indium tin oxide ("a-ITO"), an indium zinc oxide ("IZO"), polycrystalline-indium tin oxide ("poly-ITO"), or the like, or a combination comprising at least one of the foregoing materials. In an embodiment, the drain electrode 151 and the source-pixel electrode 152 may comprise at least one of the same materials, and be disposed in the same fabricating process.

The passivation layer 161 and/or the etch stopper layer may comprise an opening. A first opening can be disposed on the drain electrode pad by etching a portion of the passivation layer 161 and exposing a portion of a surface of drain electrode pad 132, specifically a top surface of the drain electrode pad 132. A second opening can be disposed on the oxide semiconductor pattern by etching a portion of the passivation layer 161 and the etch stopper layer 171 and exposing a portion of a surface of oxide semiconductor pattern 141, specifically a top surface of the oxide semiconductor pattern 141. A third opening can be disposed on the oxide semiconductor pattern 141 by etching a portion of the passivation layer 161 and the etch stopper layer 171 and exposing a portion of a surface of oxide semiconductor pattern 141, specifically a top surface of the oxide semiconductor pattern 141. The drain electrode 151 electrically connects the drain electrode pad 132 and the oxide semiconductor pattern 141 through the first opening 162 and the second opening 163. The data signal, which is transmitted to the drain electrode pad 132 from the data pad 133, can be delivered to the oxide semiconductor pattern 141 though the drain electrode 151. The data signal delivered to the oxide semiconductor pattern may be transmitted to the other side of the oxide semiconductor, near the third opening 164, through the oxide semiconductor pattern 141, and the data signal may then flow to the source-pixel electrode 152. The data signal transmitted to the source-pixel electrode can control an optical behavior of a liquid crystal layer, an organic light emitting diode, the like, or a combination comprising at least one of the foregoing devices.

According to another exemplary embodiment, the first opening 162 may be disposed on the data line 131, thereby increasing an open ratio of the pixel area. The drain electrode 151 connects the data line 131, which is disposed apart from the oxide semiconductor pattern 141, to the oxide semiconductor pattern 141 through the first opening 162 and the second opening 163. Because the source-pixel electrode 152, which may connect the oxide semiconductor and the pixel area P, can function as both a source electrode and a pixel electrode, and because the etch stopper layer 171 may be disposed in a photo mask process which is the same as a photo mask process of the oxide semiconductor pattern, the number of photo mask processes employed for the fabrication of a thin film transistor may be reduced. Also, because the etch stopper layer 171 disposed on the oxide semiconductor pattern can substantially reduce or eliminate exposure of the surface of the oxide semiconductor pattern to processes which are subsequent to disposing the oxide semiconductor pattern, such as a plasma process, a wet chemical process, or the like, deterioration of the electrical properties of a TFT comprising the oxide semiconductor pattern TFT can be substantially reduced or eliminated.

FIG. 2, FIG. 3, FIG. 4, and FIG. 5 are plan and cross-sectional views showing an exemplary embodiment of a method of fabricating a TFT.

Figure 2A:
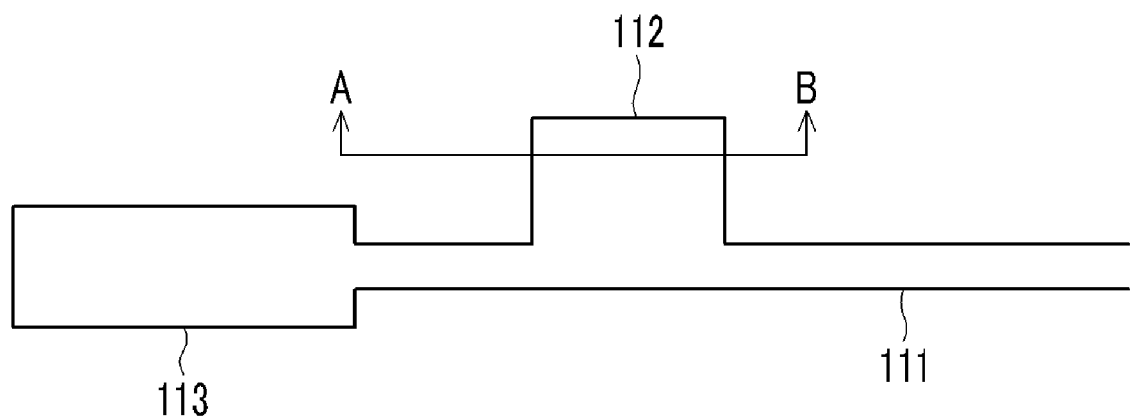
FIG. 2a is a plan view showing an exemplary embodiment of a method of fabricating the thin film transistor.
Figure 2B:
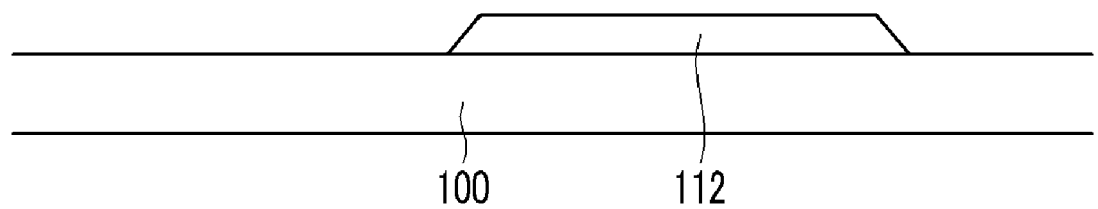
FIG. 2b is a cross sectional view showing an exemplary embodiment of a method of fabricating the thin film transistor.

FIG. 2a is a plan view showing an exemplary embodiment of a method of fabricating the gate elements, and the FIG. 2b is a cross-sectional view along line A-B of FIG. 2a.

Referring to FIG. 2a and FIG. 2b, a first metal layer (not shown) is disposed on an insulating substrate 100, and a gate electrode 112, a gate line 111, and a gate pad 113 are disposed by a photo lithographic process. The gate electrode 112 may protrude from the gate line 111, and the gate pad 113 may be disposed at the end of the gate line 111, which transmits a gate driving signal from a gate driving circuit (not shown).

Figure 3A:
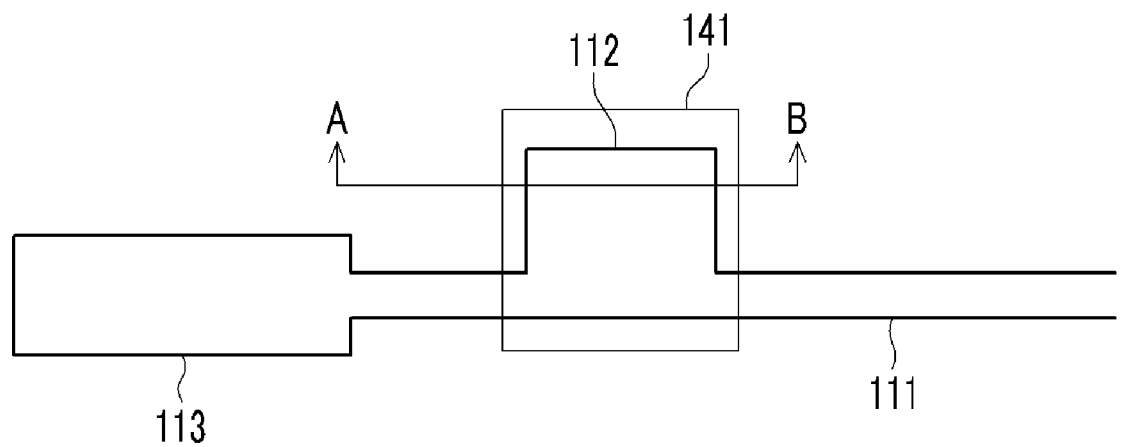
FIG. 3a is a plan view showing an exemplary embodiment of a method of fabricating the thin film transistor.
Figure 3B:
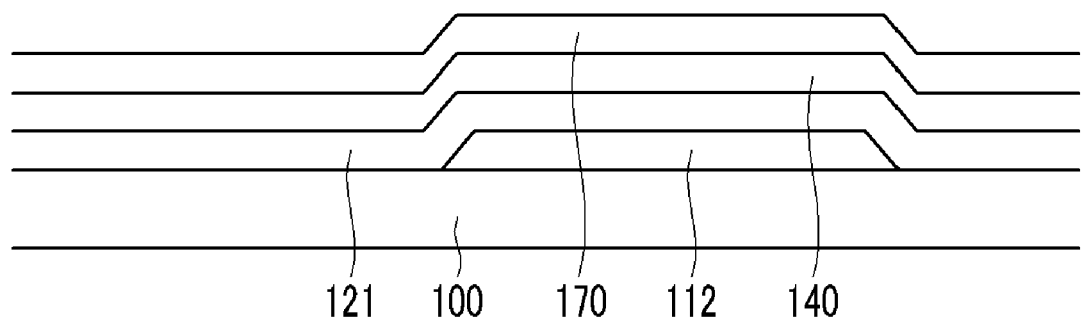
FIGS. 3b, 3c, and 3d are a cross sectional view showing an exemplary embodiment of a method of fabricating the thin film transistor.
Figure 3C:
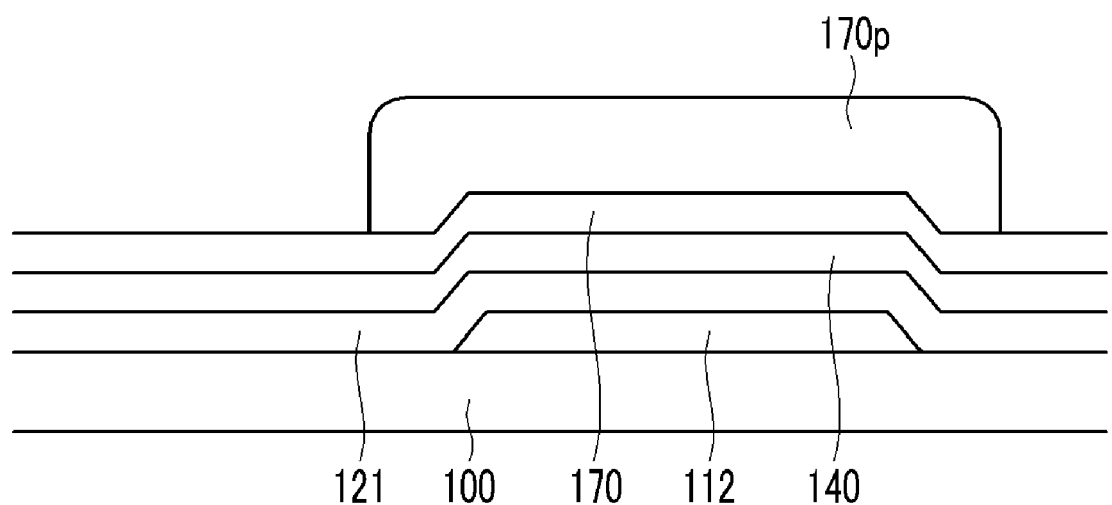
Figure 3D:
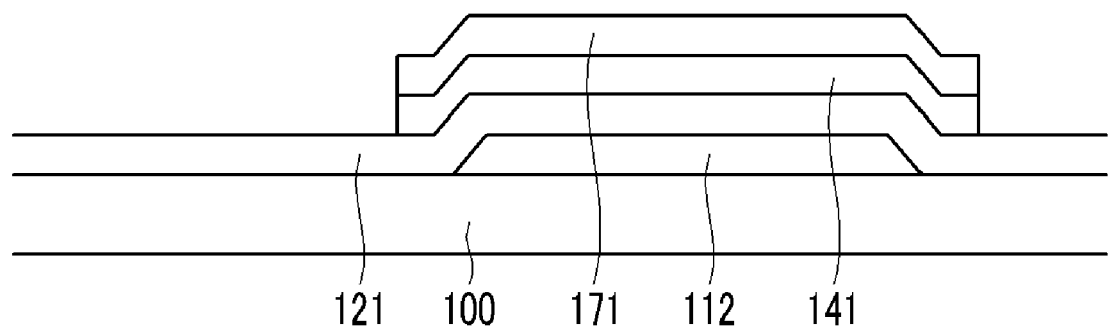

FIG. 3a is a plan view showing an exemplary embodiment of a method of fabricating the oxide semiconductor pattern and the etch stopper layer, and FIGS. 3b, 3c, and 3d are cross-sectional views along line A-B of FIG. 3a.

Referring to FIG. 3b, a gate insulating layer 121 is disposed on the gate electrode 112, the gate line 111, and the gate pad 113, by a method comprising chemical vapor deposition, physical vapor deposition, sputtering, or the like, or a combination comprising at least one of the foregoing methods. An oxide semiconductor layer 140 is disposed by a method comprising chemical vapor deposition, physical vapor deposition, sputtering or the like, or a combination comprising at least one of the foregoing methods. In an embodiment, the disposing of the oxide semiconductor layer 140 can be continuous or not continuous. An etch stopper 170 is disposed by a method comprising chemical vapor deposition, physical vapor deposition, sputtering, or the like, or a combination comprising at least one of the foregoing methods. In an embodiment, the disposing of the etch stopper can be continuous or not continuous. In an embodiment, the disposing of the gate insulating layer 121, the oxide semiconductor layer 140, or the etch stopper 170 may comprise reactive sputtering.

The gate insulating layer 121, the oxide semiconductor layer 140, and the etch stopper 170 may be continuously disposed in the same deposition chamber under vacuum, or in different deposition chambers under vacuum using the load lock system which can transfer a substrate to another deposition chamber.

Referring to FIG. 3c, a photo resist layer is disposed on the etch stopper 170. The photo resist layer can comprise both a positive photo resist, which comprises a Photo Acid Generator ("PAG"), and a negative photo resist, which comprises a Photo Active Cross Linker ("PAC"). The photo resist layer may be selectively exposed using an optical mask (not shown). The photo resist layer, which has photochemical properties which are changed by exposure to light, is then developed, thereby disposing a photo resist layer pattern 170p, which comprises a desired shape.

Referring to FIG. 3d, the etch stopper 170 and the oxide semiconductor layer 140 are sequentially etched by a dry etching, a wet etching method, or combination thereof, using the photo resist layer 170p as an etching mask. In an embodiment, the etch stopper 170 and the oxide semiconductor layer 140 may be etched using the same etching conditions. After an etching process, a etch stopper layer 171, and a oxide semiconductor pattern 141, are disposed on the gate electrode 112, and the etch stopper layer 171, and the oxide semiconductor pattern 141, may comprise substantially the same planar shape because the two layers are etched using the same photo resist layer pattern 170p as an etching mask.

Figure 4A:
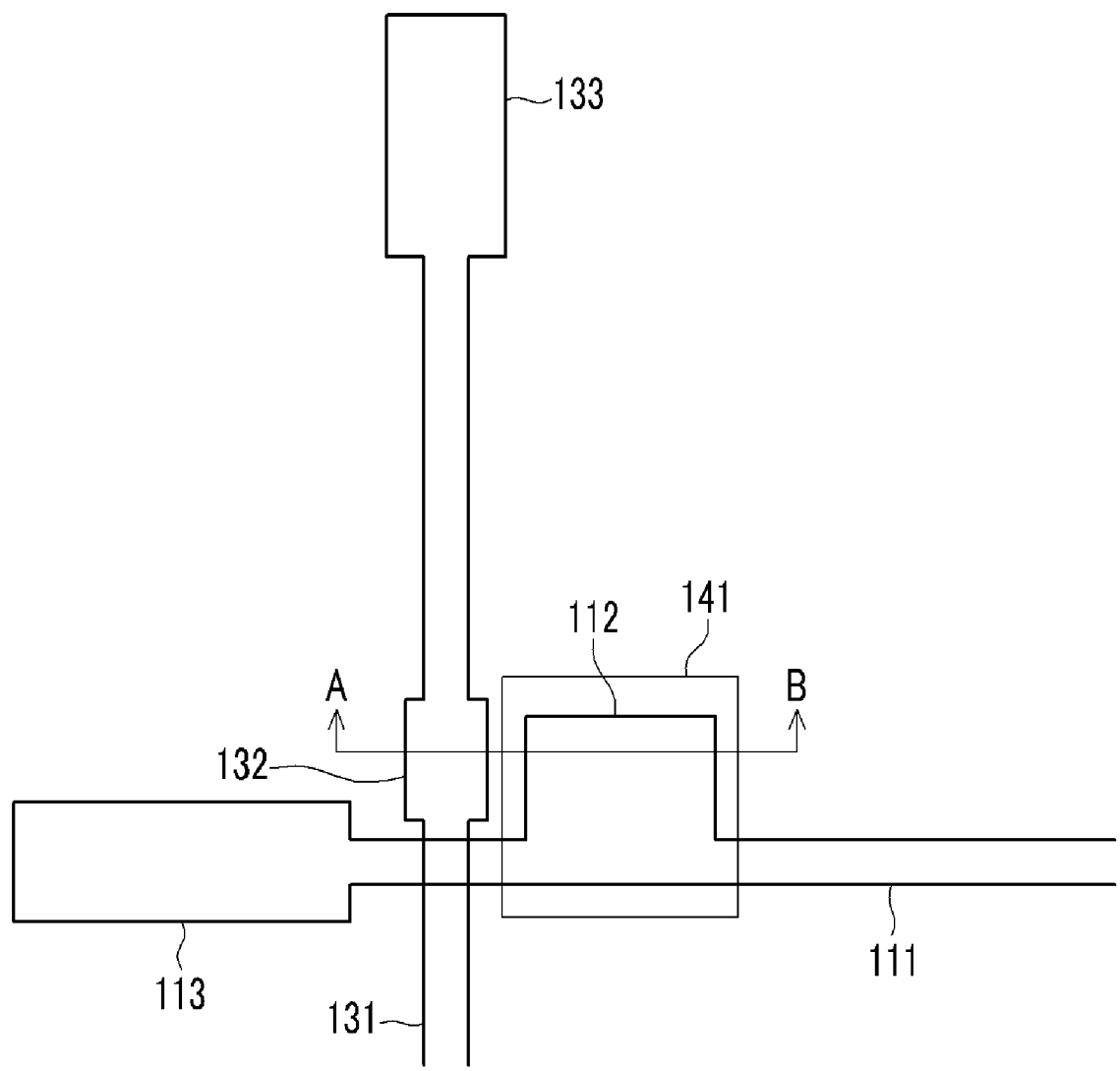
FIG. 4a is a plan view showing an exemplary embodiment of a method of fabricating the thin film transistor.
Figure 4B:
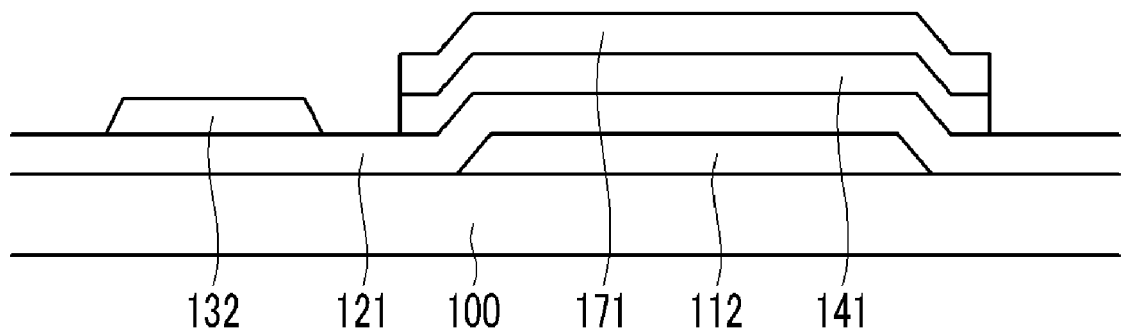
FIG. 4b is a cross sectional view showing an exemplary embodiment of a method of fabricating the thin film transistor.

FIG. 4a is a plan view showing an exemplary embodiment of a method of fabricating the data line 131, and FIG. 4b is a cross-sectional view along line A-B of FIG. 4a.

Referring to FIG. 4a and FIG. 4b, a data line layer (not shown) is disposed on the gate insulating layer 121 and the etch stopper layer 171 by a method comprising chemical vapor deposition, physical vapor deposition, sputtering, or the like, or a combination comprising at least one of the foregoing methods. A photo resist layer is disposed on the data line layer (not shown). The photo resist layer may be selectively exposed using an optical mask (not shown). The photo resist layer, which has photochemical properties, which are changed by exposure to light, is developed, thereby disposing a photo resist layer pattern comprising a desired shape.

Thereafter, the data line layer (not shown) can be etched using the photo resist layer pattern as an etching mask. The data line layer (not shown) can be etched by a dry etching method, a wet etching method, or combination thereof. A data line 131, a drain electrode pad 132, and a data pad 133, can be disposed on the gate insulating layer 121 by the dry etching method, the wet etching method, or combination thereof. The drain electrode pad 132 comprises a first width, and the data line 131 comprises a second width. In an embodiment, the first width and the second width can be substantially the same, or the first width can be greater than the second width. The data line 131 and the gate line 111 may intersect each other at selected locations.

Figure 5A:
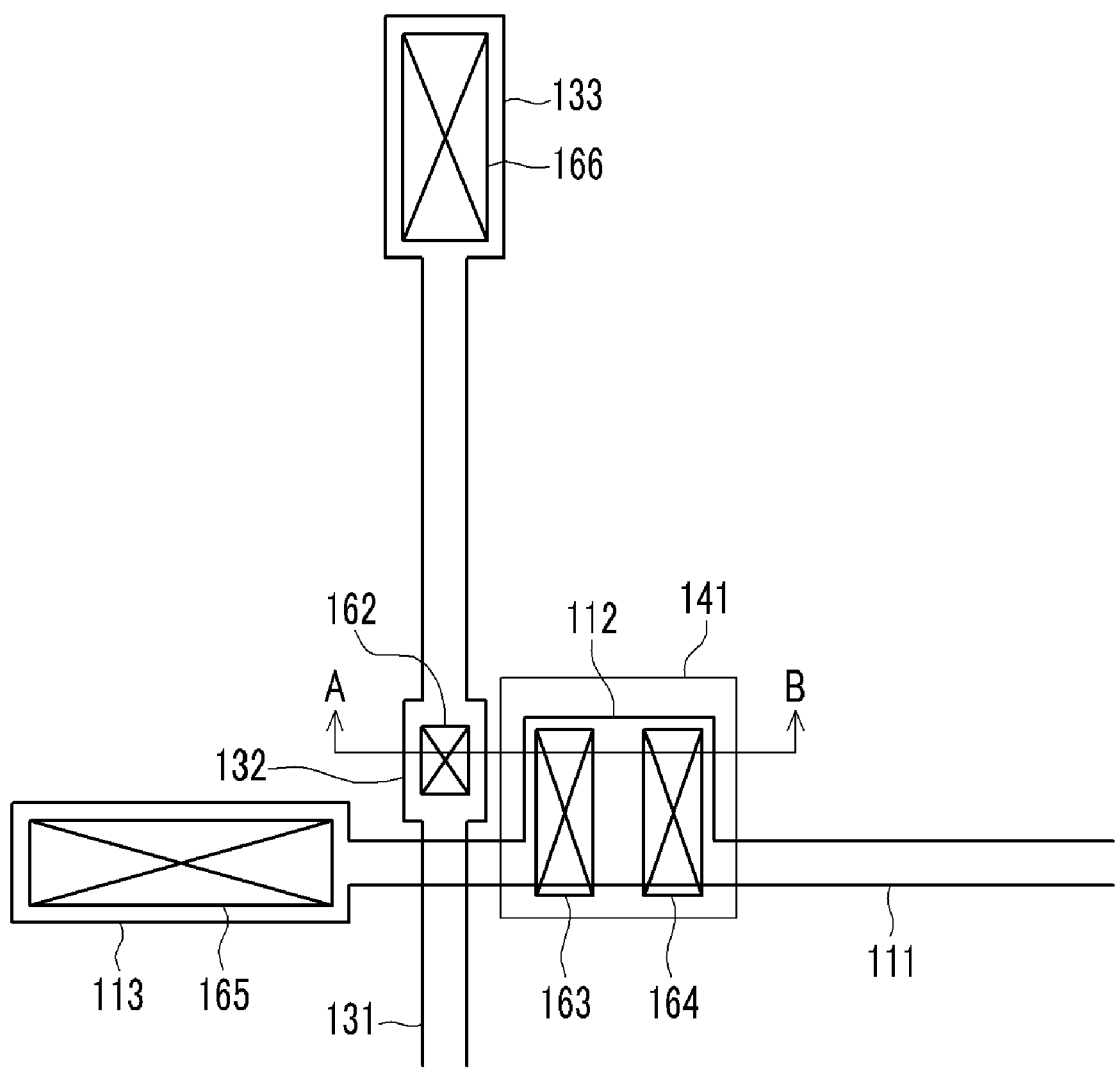
FIG. 5a a plan view showing an exemplary embodiment of a method of fabricating the thin film transistor.
Figure 5B:
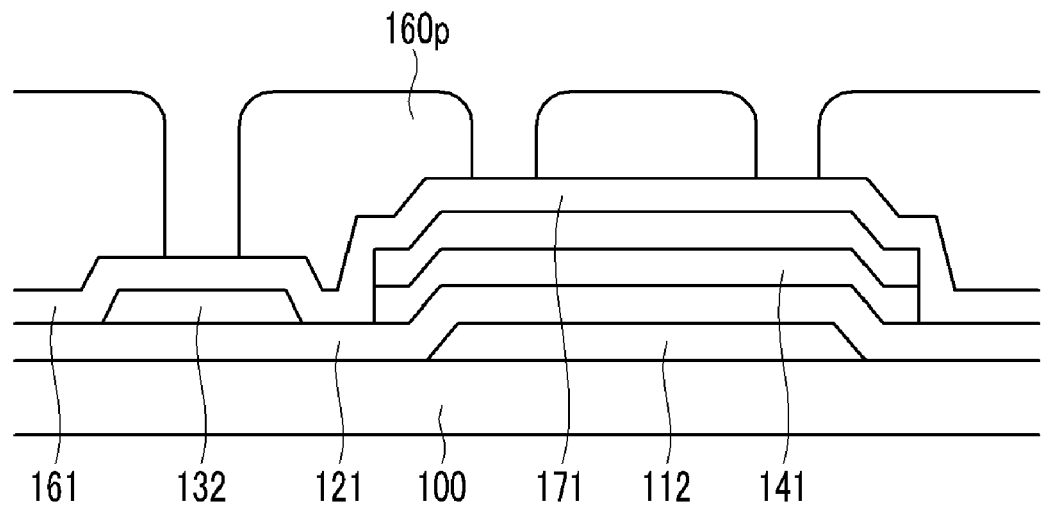
FIG. 5b, FIG. 5c, and FIG. 5d are cross-sectional views showing an exemplary embodiment of a method of fabricating the thin film transistor.
Figure 5C:
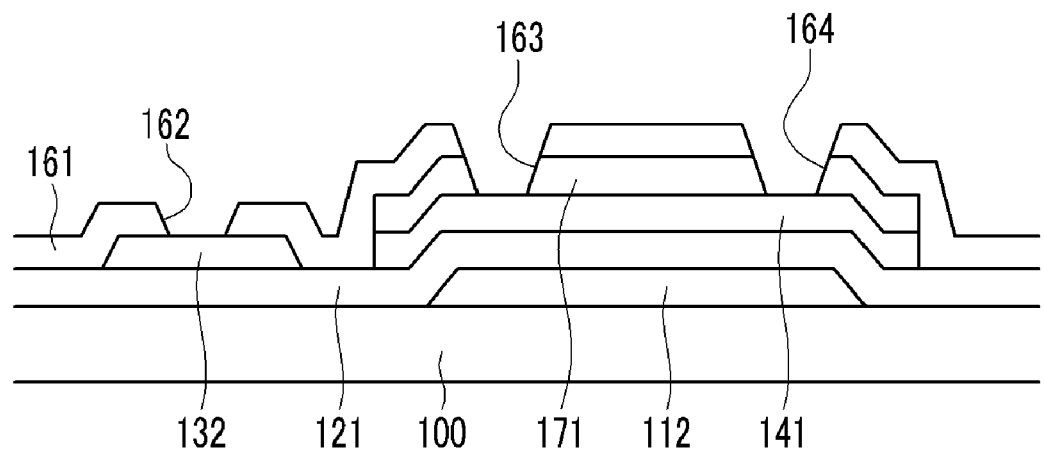
Figure 5D:
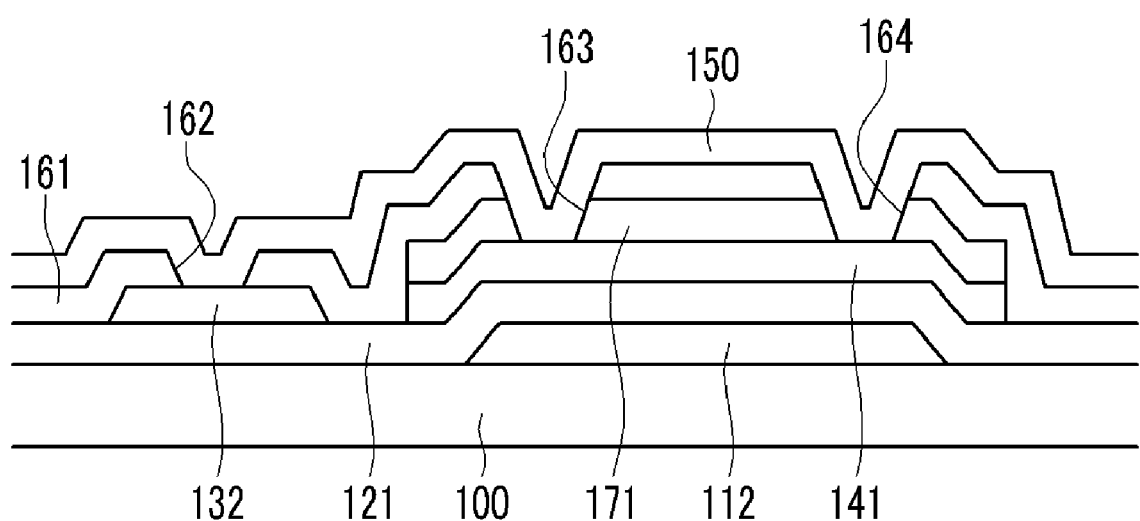

FIG. 5a is a plan view showing an exemplary embodiment of a method of fabricating contact openings and pad openings, and FIGS. 5b, 5c and 5d are cross-sectional views along line A-B of FIG. 5a.

Referring to FIG. 5b, a passivation layer 161 is disposed on the data line 131, and the etch stopper layer 171. A thickness of the passivation layer 161 is between about 1000 Å to about 20000 Å, specifically between about 2000 Å to about 15000 Å, more specifically between about 4000 Å to about 10000 Å, and the passivation layer 161 can be disposed by a method comprising chemical vapor deposition, physical vapor deposition, sputtering, or the like, or a combination comprising at least one of the foregoing methods. A photo resist layer is then disposed on the passivation layer 161. The photo resist layer may be selectively exposed using an optical mask (not shown). The photo resist layer, which has photochemical properties, which are changed by exposure to light, is developed, thereby obtaining a photo resist layer pattern 160p comprising a desired shape for contact and pad openings, such as the first opening 162, the second opening 163, the third opening 164, a gate pad opening 165, a data pad opening 166.

Referring to FIG. 5c, the passivation layer 161 and/or the etch stopper layer can be etched using the photo resist layer pattern 160p as an etching mask. The passivation layer 161 and/or the etch stopper layer can be etched by a dry etching method, a wet etching method, or combination thereof. A first opening 162 may be disposed by etching the passivation layer, a second opening 163 may be disposed by etching the passivation layer and the etch stopper layer, and a third opening may be disposed by etching the passivation layer and the etch stopper layer. A gate pad opening and a data pad opening can also be disposed. The first opening 162 exposes a surface of the drain electrode pad 132, and the second opening 163 and the third opening 164 can expose a surface of the oxide semiconductor pattern, respectively. The gate pad opening 165 and the data pad opening can expose a surface of the gate pad 113 and the data pad 133, respectively.

Referring to FIG. 5a and FIG. 5c, the first opening 162, and the data pad opening 166, can be disposed by etching the passivation layer 161, and the second opening and the third opening can be disposed by etching both the passivation layer 161 and the etch stopper layer 171. The gate pad opening 165 can be disposed by etching the passivation layer 161 and the gate insulating layer 121. Because a surface of the drain pad 133 and a surface of the drain electrode pad are exposed to an etching condition after the first opening and the data pad opening are disposed, the drain pad and the data pad can be selectively etched with respect to an etching condition of the gate insulating layer 121.

Referring to FIG. 5d, a transparent conducting layer 150 can be disposed on the passivation layer 161, and a plurality of surface can be exposed by the openings 162, 163, 164, 165, and 166. The thickness of the transparent conducting layer 150 is between about 100 Å to about 10000 Å, specifically between about 500 Å to about 5000 Å, more specifically between about 1000 Å to about 4000 Å, and a transparent conducting layer 150 can be disposed by method comprising chemical vapor deposition, physical vapor deposition, sputtering, or the like, or a combination comprising at least one of the foregoing methods. Next, a photo resist layer can be disposed on the transparent conducting layer 150. The photo resist layer may be selectively exposed using an optical mask (not shown). The photo resist layer, which has photochemical properties which are changed by exposure to light, is developed, thereby disposing a photo resist layer pattern comprising a desired shape. Next, the transparent conducting layer 150 can be etched using the photo resist layer pattern as an etching mask. The transparent conducting layer 150 can be etched by a dry etching method, a wet etching method, or combination thereof. Next, a drain electrode 151, a source-pixel electrode 152, a gate pad cover electrode 153, and a data pad cover electrode can be disposed.

An etch stopper oxide semiconductor TFT can comprise the disclosed etch stopper layer and the disclosed oxide semiconductor pattern.

Figure 6:
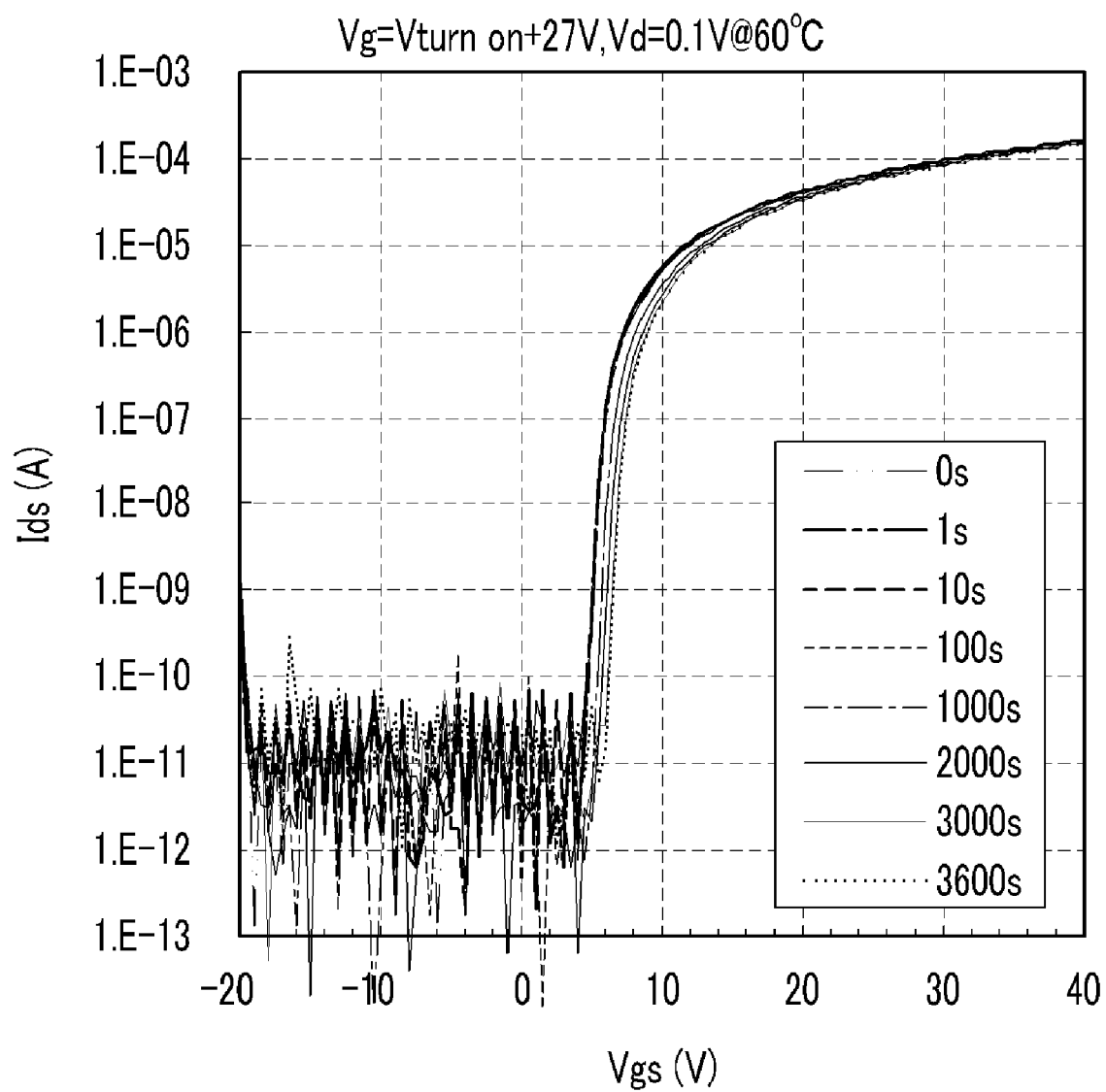
FIG. 6 is a graph illustrating current with respect to voltage corresponding to an exemplary embodiment of a thin film transistor.

FIG. 6 is a graph illustrating current with respect to voltage an etch stopper oxide semiconductor TFT fabricated according to an exemplary embodiment.

Referring to FIG. 6, because a threshold voltage of the etch stopper oxide semiconductor TFT is higher than 0 volts, the etch stopper oxide semiconductor TFT can be applied to a driving circuit integrated display, in which a pixel switching TFT and a peripheral driving TFT are disposed.

The disclosed TFT has been observed to provide reduced variation in a current-voltage characteristic, such as a threshold voltage, a value of the current in an on state, or a value of the current in an off state, before and after electrical stress at a stress temperature of 60° C., wherein a gate to source stress voltage is about 27 volts, a drain to source stress voltage is about 0.1 volts, and an electrical stress time is between about 1 second to about 3600 seconds, specifically between about 10 seconds to about 3000 seconds, more specifically between about 100 seconds to about 2000 seconds. Thus it has been observed that an etch stopper oxide semiconductor TFT, fabricated according the exemplary embodiment, can substantially improve or eliminate color degradation, which can be cause by electrical stress on the a TFT.

Referring to an exemplary embodiment, because the source-pixel electrode 152 comprises a transparent conducting material, which can function as both a source electrode and a pixel electrode, which comprises a pixel area P, it can transmit a back-light. Accordingly, a transmittance can be increased. Also, because the etch stopper layer 171 disposed on the oxide semiconductor pattern 141 can cover substantially an entire surface of the oxide semiconductor pattern 141, the surface of the oxide semiconductor pattern 141 is not exposed to processes which can be subsequent to the disposing of the oxide semiconductor pattern. Thus the disclosed TFT and method of fabrication can substantially reduce or eliminate degradation of the electrical properties of a TFT, including an oxide semiconductor thin film transistor. Moreover, because the etch stopper layer 171 and the oxide semiconductor pattern 141 can be disposed using the same photo resist pattern, it is possible to simplify a mask step in a process for disposing an oxide semiconductor TFT.

What is claimed is:

1. A thin film transistor substrate comprising:
   a gate line and a gate electrode disposed on an insulating substrate;
   an oxide semiconductor pattern disposed adjacent to the gate electrode;
   a data line electrically insulated from the gate line;
   a first opening exposing the data line corresponding to a drain electrode pad;
   a second opening exposing the oxide semiconductor pattern; and
   a drain electrode disposed in the first opening and contacting the drain electrode pad, the drain electrode extending from the first opening to the second opening and electrically connecting the drain electrode pad exposed in the first opening and the oxide semiconductor pattern exposed in the second opening.

2. The thin film transistor of claim 1, wherein a second insulating layer and a third insulating layer are disposed on the oxide semiconductor pattern.

3. The thin film transistor of claim 2, wherein a third opening exposes the oxide semiconductor pattern.

4. The thin film transistor of claim 3, wherein the second opening and the third opening expose the oxide semiconductor pattern through the second insulating layer and the third insulating layer.

5. The thin film transistor of claim 4, wherein the first opening exposes the oxide semiconductor pattern through the third insulating layer.

6. The thin film transistor of claim 5, wherein a source-pixel electrode is electrically connected to the oxide semiconductor pattern through the third opening.

7. The thin film transistor of claim 6, wherein the source-pixel electrode is in direct contact with the oxide semiconductor pattern.

8. The thin film transistor of claim 7, wherein the oxide semiconductor pattern comprises at least one of Ga, In, Zn, Sn, Ta, Ti, Cr, Hf, Y, Fe, Ru, Cd, Li Be, Na, Mg, V, Zr, Nb, Sc, W, Mn, Fe, Ni, Pd, Cu, B, Al, Ge, Si, C, N, P, F, and O, and a combination comprising at least one of the foregoing elements.

9. The thin film transistor of claim 1, wherein the drain electrode comprises at least one of Ga, In, Zn, Sn, Ta, Ti, Cr, Hf, Y, Fe, Ru, Cd, Li Be, Na, Mg, V, Zr, Nb, Sc, W, Mn, Fe, Ni, Pd, Cu, B, Al, Ge, Si, C, N, P, F, and O, and a combination comprising at least one of the foregoing elements.

10. The thin film transistor of claim 1, wherein the data line is disposed apart from the oxide semiconductor pattern.

11. The thin film transistor of claim 10, wherein the source-pixel electrode comprises a first material, the drain electrode comprises a second material, and the first material is the same as the second material.

12. The thin film transistor of claim 11, wherein the source-pixel electrode defines a pixel area.

13. The thin film transistor of claim 2, wherein an edge of the second insulating layer comprises a shape which corresponds to a shape of an edge of the oxide semiconductor pattern.

14. The thin film transistor of claim 13, wherein the drain electrode pad comprises a third material, the data line comprises a fourth material, and the third material is the same as the fourth material.

15. The thin film transistor of claim 14, wherein the drain electrode is in direct contact with the drain electrode pad.

16. The thin film transistor of claim 15, wherein the third opening exposes the oxide semiconductor pattern.

17. The thin film transistor of claim 16, wherein a source-pixel electrode is in direct contact with the oxide semiconductor pattern through the third opening.

18. The thin film transistor of claim 17, wherein the drain electrode pad comprises a third material, the source-pixel electrode comprises a first material, and the third material is the same as the first material.

19. A thin film transistor substrate comprising:
a gate line and a gate electrode disposed on an insulating substrate;
an oxide semiconductor pattern disposed adjacent to the gate electrode;
a data line, which is insulated from the gate line, disposed on the insulating substrate;
a first opening exposing the data line;
an etch stopper layer has a shape substantially the same as the oxide semiconductor pattern;
a second opening exposing the oxide semiconductor pattern; and
a drain electrode disposed in the first opening and the second opening,
wherein the drain electrode electrically connects the data line and the oxide semiconductor pattern through the first opening and the second opening, respectively.

* * * * *